(12) United States Patent
Ohmori

(10) Patent No.: US 6,980,470 B2
(45) Date of Patent: Dec. 27, 2005

(54) MAGNETIC STORAGE ELEMENT, RECORDING METHOD USING THE MAGNETIC STORAGE ELEMENT

(75) Inventor: Hiroyuki Ohmori, Kanagawa (JP)

(73) Assignee: Sony Corporation, Tokyo (JP)

( * ) Notice: Subject to any disclaimer, the term of this patent is extended or adjusted under 35 U.S.C. 154(b) by 107 days.

(21) Appl. No.: 10/705,153

(22) Filed: Nov. 11, 2003

(65) Prior Publication Data
US 2004/0136233 A1 Jul. 15, 2004

(30) Foreign Application Priority Data
Nov. 13, 2002 (JP) .......................... P2002-329859

(51) Int. Cl.[7] .............................................. G11C 11/14
(52) U.S. Cl. ..................................... 365/171; 365/173
(58) Field of Search ............................. 365/171, 173, 365/158, 145

(56) References Cited

U.S. PATENT DOCUMENTS

| | | | | |
|---|---|---|---|---|
| 5,194,708 A | * | 3/1993 | Carter, Jr. .................... 219/624 |
| 5,325,345 A | * | 6/1994 | Shimokawato et al. .... 369/13.03 |
| 5,583,727 A | * | 12/1996 | Parkin ......................... 360/324 |
| 5,600,297 A | * | 2/1997 | Ruigrok et al. ........... 338/32 R |
| 5,783,320 A | * | 7/1998 | Shimazaki et al. ....... 428/820.6 |
| 6,271,998 B1 | * | 8/2001 | Coehoorn et al. ......... 360/324.2 |
| 6,538,919 B1 | * | 3/2003 | Abraham et al. ........... 365/171 |
| 6,649,254 B1 | * | 11/2003 | Victora et al. .............. 428/212 |
| 6,765,769 B2 | * | 7/2004 | Mizuguchi ............. 360/324.11 |
| 6,771,473 B2 | * | 8/2004 | Hiramoto et al. ........ 360/324.2 |
| 6,781,799 B2 | * | 8/2004 | Seyama et al. ........ 360/324.11 |
| 6,850,433 B2 | * | 2/2005 | Sharma et al. .............. 365/173 |

* cited by examiner

Primary Examiner—Michael Tran
(74) Attorney, Agent, or Firm—Sonnenschein, Nath & Rosenthal LLP

(57) ABSTRACT

The present invention provides a magnetic storage element capable of recording with a small amount of recording current without reducing a coercive force of the magnetic storage element employed in an MRAM and a recording method using the same. The magnetic storage element at least comprises a first magnetic layer, a non-magnetic layer, a third magnetic layer and a second magnetic layer, which are stacked, and in the stacked structure, two magnetic layers having different magnetization thermal properties with each other with the non-magnetic layer are positioned therebetween.

5 Claims, 8 Drawing Sheets

HEATING

⇐ EXTERNAL MAGNETIC FIELD

1000e

1000e

US 6,980,470 B2

MAGNETIC STORAGE ELEMENT, RECORDING METHOD USING THE MAGNETIC STORAGE ELEMENT

CROSS REFERENCES TO RELATED APPLICATIONS

The present document is based on Japanese Priority Document JP 2002-329859, filed in the Japanese Patent Office on Nov. 13, 2002, the entire contents of which being incorporated herein by reference.

BACKGROUND OF THE INVENTION

1. Field of the Invention

The present invention relates to a magnetic storage element preferably applicable to a nonvolatile memory, and a recording method using the same.

2. Description of Related Art

In information apparatuses such as personal computers, a dynamic RAM (DRAM) is widely used as a random access memory (RAM) operable at a high speed and having a large storage density and a large capacity. As a design rule of the DRAM becomes more minute, a transistor becomes miniaturized, and besides, a capacitor is fabricated using a trench structure to ensure a larger capacity with a smaller size. However, in view of a further demand for a larger storage density of the DRAM, a technical limitation in the conventional trench structure is a bottleneck for ensuring a larger capacity. In addition, the DRAM is classified as a volatile memory which cannot keep information when the power supply is interrupted, so that there is a demand for a non-volatile memory which can keep information at any time. A FLASH memory is widely used as a nonvolatile memory. However, the FLASH memory has problems such as limitation in the number of rewritable times and a parasitic effect due to cell reduction so that it cannot be a substitution for the DRAM. One example for a next generation non-volatile memory relates to a magnetic random access memory (MRAM) which uses magnetic storage elements capable of utilizing magnetization of a magnetic material for recording information and a development thereof is under way.

The MRAM comprises a number of magnetic storage elements, and writes and reads data by connecting each of the magnetic storage elements to a word line or a bit line. The magnetic storage element of the MRAM determines "0" or "1" depending on a direction of the magnetization in a storage layer comprising a magnetic material.

The MRAM can have a simplified structure, it is possible to realize a further larger storage density which is difficult to realize with the DRAM. In addition, since data is recorded in accordance with a direction of a magnetic moment (direction of magnetization) of each storage layer, it is expected to have the number of rewritable times, rewriting time duration and reading time duration as those of the DRAM (for example, see a non-patent document 1).

[Non-patent Document 1]

Nikkei Electronics, Feb. 12, 2001 (Pages 152–171, Table 1)

SUMMARY OF THE INVENTION

The storage layer of the magnetic storage element constituting the MRAM utilizes a demagnetizing field generated by having the magnetic material being rectangular or oval to retain a stable magnetization state. However, the magnetic material has a larger coercive force as the size thereof is reduced.

In addition, in the MRAM, data is recorded on the magnetic storage element by applying a magnetic field due to an electric current of a word line or a bit line. Accordingly, reduction in size of the magnetic storage element increases the coercive force so that a larger amount of current is required at the time of recording data. In other words, increase in storage capacity of the MRAM results in larger current consumption. It is therefore required for reducing a recording current of the magnetic storage element to suppress the coercive force thereof.

On the other hand, there is also a problem conflicting the task for reducing the recording current that when the magnetic storage element is made smaller, a coercive force to some extent is required for retaining the recording information stably.

In view of the above-mentioned problems, the present invention provides a magnetic storage element capable of holding recorded information stably and of recording information with a smaller magnetic field, and a recording method using the same.

A magnetic storage element according to the present invention comprises at least a first magnetic layer, a non-magnetic layer and a second magnetic layer which are stacked, wherein: the first magnetic layer comprises a ferrimagnetic material of a rare-earth metal-transition metal alloy in which an amount of magnetization of a ferromagnetic material mainly composed of a transition metal or a transition metal atom is larger than that of a rare-earth metal atom, the second magnetic layer comprises a ferrimagnetic material containing a rare-earth metal-transition metal alloy having a compensation temperature, and a magnetic moment of the transition metal atom of the first magnetic layer and a magnetic moment of the rare-earth metal atom of the second magnetic layer are magnetically coupled to be in parallel.

A recording method of a magnetic record device according to the present invention is used for a magnetic storage element comprising: at least a first magnetic layer, a non-magnetic layer and a second magnetic layer which are stacked, wherein: the first magnetic layer comprises a ferrimagnetic material of a rare-earth metal-transition metal alloy in which an amount of magnetization of a ferromagnetic material mainly composed of a transition metal or a transition metal atom is larger than that of a rare-earth metal atom, the second magnetic layer comprises a ferrimagnetic material containing a rare-earth metal-transition metal alloy having a compensation temperature, a magnetic moment of the transition metal atom of the first magnetic layer and a magnetic moment of the rare-earth metal atom of the second magnetic layer are magnetically coupled to be in parallel, wherein recording is carried out by heating the magnetic storage element locally, and applying a magnetic field at a temperature where a magnetization amount of the first magnetic layer and a magnetization amount of the second magnetic layer are equal.

In the magnetic storage element of the present invention, since the first magnetic layer comprises a ferrimagnetic material of a rare-earth metal-transition metal alloy in which an amount of magnetization of a ferromagnetic material mainly composed of a transition metal or a transition metal atom is larger than that of a rare-earth metal atom, a direction of the magnetization of the first magnetic layer becomes the same as the magnetization by the transition metal atom so that magnetization amount varies little owing to temperature rise. On the other hand, since the second magnetic layer comprises a ferrimagnetic material containing a rare-earth metal-transition metal alloy having a compensation temperature, in a room temperature, the amount of magnetization by the rare-earth metal atom is larger than that of the transition metal atom and a direction of the magnetization of the second magnetic layer is the same as that of the rare-earth metal atom. The amount of magnetization by the rare-earth metal atom decreases as the temperature rises.

The ferrimagnetic material is such as an alloy of a rare-earth metal element such as Gd and a transition metal element such as Co, for example, in which each atom has a magnetic moment and those magnetic moments are anti-parallel to each other.

And the compensation temperature is a temperature where the magnetic moment of the rare-earth metal element whose temperature variation is large and the magnetic moment of the transition metal element whose temperature variation is small cancel each other in the ferrimagnetic material and spontaneous magnetization of the ferrimagnetic material disappears. The compensation temperature can be adjusted depending on a composition and a layered structure of the magnetic layer. Therefore, the magnetization of the second magnetic layer disappears at the compensation temperature and the direction of the magnetization thereof becomes the same as that of the transition metal atom at or above the compensation temperature.

Since the first magnetic layer, the non-magnetic layer and the second magnetic layer are stacked, relatively strong magnetic interaction occurs between the first and the second magnetic layer having the non-magnetic layer therebetween. The magnetic interaction having the non-magnetic layer therebetween is different from a magnetostatic magnetic coupling. Since the magnetization by the transition metal atom of the first magnetic layer and the magnetization by the transition metal atom of the second magnetic layer are in anti-parallel, the magnetization by the transition metal atom of the first magnetic layer becomes parallel with the magnetization by the rare-earth metal atom of the second magnetic layer. In other words, the magnetization of the first magnetic layer and the magnetization of the second magnetic layer become stable in a parallel state. At or under the compensation temperature, the magnetization of the two magnetic layers becomes parallel as described above, and apparent magnetization increases and the coercive force increases to have a stable storage state.

On the other hand, at or over the compensation temperature, there occurs a relatively strong magnetic interaction between the first and the second magnetic layers having the non-magnetic layer therebetween and the magnetization of the second magnetic layer and the magnetization by the transition metal atom of the second magnetic layer become the same direction. Accordingly, the magnetization of the first magnetic layer and the magnetization of the second magnetic layer become anti-parallel and apparent magnetization becomes small so that the coercive force becomes small, which results in easy reversing the magnetization with a small magnetic field for data recording.

In addition, in the magnetic storage element of the present invention, a structure in which a ferromagnetic layer mainly composed of a transition metal is formed may be possible. In a case where the magnetic interaction is weak under a condition that the magnetization of the first magnetic layer and the magnetization of the second magnetic layer are in parallel at or under the compensation temperature, the magnetization state may be disturbed by a demagnetizing field, it is possible to improve the magnetic interaction between the first magnetic layer and the second magnetic layer by disposing the ferromagnetic layer mainly composed of a transition metal between the second magnetic layer and the non-magnetic layer.

According to the recording method using a magnetic storage element of the present invention, since recording is carried out by locally heating the magnetic storage element of the present invention and applying a magnetic field at a temperature that magnetization of the two magnetic layers becomes equal, it is possible to record under a condition having almost no apparent magnetization and with an extraordinary small magnetic field.

According to the magnetic storage element and the recording method using the magnetic storage element of the present invention, respective magnetization directions generated in two magnetic layers at the room temperature are in parallel and in the same direction. Therefore, the coercive force becomes large so that a stable recorded state can be realized in the magnetic storage element.

According to the magnetic storage element and the recording method of the magnetic storage element of the present invention, since the directions of the magnetization of the two magnetic layers are opposed to each other by heating, the coercive force becomes small so that recording can be easily performed in the magnetic storage element. In addition, in the case of recording using the current induced magnetic field, recording can be performed with a low current.

Furthermore, in the case of heating by directly applying an electric current to the magnetic storage element, a magnetic field can be applied to the magnetic storage element by the electric current. Accordingly, in this case, a single mechanism can be used both for heating and for applying a magnetic field so that a structure of the drive circuit can be made simple.

DESCRIPTION OF THE PREFERRED EMBODIMENTS

Now, with reference to the attached drawings, embodiments of the present invention will be described.

Figure 1:
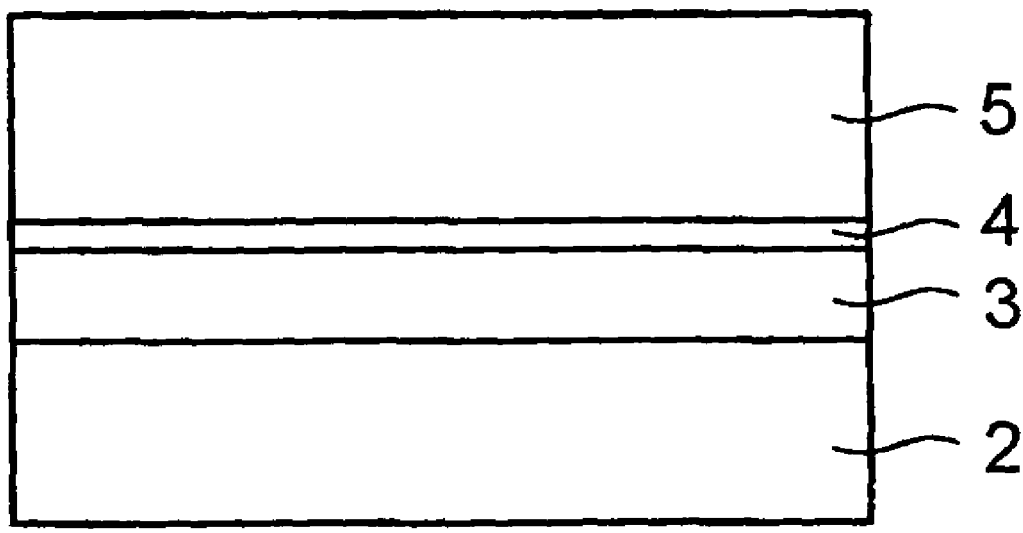
FIG. 1 is a schematic cross-sectional view of one embodiment of a magnetic storage element according to the present invention.

A schematic cross-sectional view of one embodiment of a magnetic storage element according to the present invention is shown in FIG. 1. A magnetic storage element 1 shown in FIG. 1 comprises at least a first magnetic layer 2, a non-magnetic layer 3, a third magnetic layer 4 and a second magnetic layer 5, which are stacked.

It is to be noted that the first magnetic layer 2 and the second magnetic layer 5 have different temperature characteristics in magnetization. In other words, the first magnetic layer 2 is a layer whose magnetization amount is little affected by temperature, and as the first magnetic layer 2, materials such as a ferromagnetic material mainly composed on a transition metal or a ferrimagnetic material containing a rare-earth metal-transition metal alloy whose magnetization amount by a transition metal atom is larger than that of a rare-earth metal atom can be used. The second magnetic layer 5 is a layer whose magnetization amount is largely affected by the temperature, and a ferrimagnetic material containing a rare-earth metal-transition metal alloy having a compensation temperature can be used as the second magnetic layer 5. In this rare-earth metal-transition metal alloy having the compensation temperature, the magnetization amount by the rare-earth metal atom is larger than that of the transition metal atom.

Since the ferromagnetic material mainly composed of a transition metal or the ferrimagnetic material containing a rare-earth metal-transition metal alloy whose magnetization amount by a transition metal atom is larger than that of a rare-earth metal atom is used as the first magnetic layer 2, a direction of magnetization of the whole magnetic layer 2 coincides with a direction of magnetic moment of the transition metal atom. Since the ferrimagnetic material having the compensation temperature, in which the magnetization amount by the rare-earth metal atom is larger than that of the transition metal atom is used as the second magnetic layer 5, the magnetic moment of the rare-earth metal atom is larger than that of the transition metal atom, and a direction of magnetization of the whole magnetic layer 2 coincides with the magnetic moment of the rare-earth metal atom. Since the first magnetic layer 2 and the second magnetic layer 5 are stacked having the non-magnetic layer 3 therebetween, the first magnetic layer 2 and the second magnetic layer 5 are anti-ferromagnetically coupled so that a direction of the magnetic moment of the transition metal atom of the first magnetic layer 2 and a direction of the magnetic moment of the rare-earth metal atom of the second magnetic layer 5 are in anti-parallel to each other, that is, a direction of magnetization of the whole first magnetic layer 2 and a direction of magnetization of the whole second magnetic layer 5 become anti-parallel to each other. In addition, it is preferable for the non-magnetic layer 3 to have a thickness of 3 nm or less in order to avoid a magnetic adverse effect. In a case of using Co as the non-magnetic layer 3, it is enough to have a thickness of around 0.3 nm. In addition, the ferrimagnetic material containing the rare-earth metal-transition metal alloy tends to be a perpendicularly magnetized film so that it is at least necessary to have a saturated magnetic flux density to some extent at a room temperature to suppress perpendicular magnetization. Taking thermal stability in consideration, it is desirable that both the first magnetic layer 2 and the second magnetic layer 5 have a saturation magnetic flux density of 0.2 tesla or more.

Furthermore, the magnetic storage element 1 of the present embodiment is provided with the third magnetic layer 4 between the non-magnetic layer 3 and the second magnetic layer 5. A ferromagnetic material mainly composed of a transition metal is employed for the third magnetic layer 4. At or under the compensation temperature, the directions of magnetization of the first magnetic layer 2 and the second magnetic layer 5 are in parallel so that the magnetic interaction between the magnetic layers 2 and 5 may be disturbed by a demagnetizing field if the magnetic interaction is weak. Accordingly, in order to strengthen the magnetic interaction, the third magnetic layer 4 composed of the ferromagnetic material mainly composed of the transition metal is provided.

By arranging the first magnetic layer 2, the non-magnetic layer 3, the third magnetic layer 4 and the second magnetic layer 5 in a stacking structure, the storage layer recording information in accordance with the magnetization of the magnetic material is constituted.

In a case of the magnetic storage element being rectangular, a single-layer magnetic material has a stable magnetization in a longitudinal direction. Generally the magnetic storage element small in size with a large aspect ratio and large magnetization has a larger coercive force. Therefore, in order to have a smaller coercive force, apparent magnetization may be made small.

The magnetic storage element 1 may comprise an amorphous CoSiB layer having a thickness of 5 nm as the first magnetic layer 2, an Ru layer having a thickness of 0.8 nm as the non-magnetic layer 3, a Co layer having a thickness of 0.2 nm as the third magnetic layer 4, and a GdFeCo layer having a thickness of 12 nm as the second magnetic layer 5, in which a compensation temperature of the GdFeCo layer is 100° C.

Furthermore, in a case where both the first magnetic layer 2 and the second magnetic layer 5 are amorphous layers, resistance of the first magnetic layer 2 and the second magnetic layer 5 becomes higher so that more electric current flows through the non-magnetic layer 3. This results in that the non-magnetic layer 3 becomes a center of the electric current so that a current induced magnetic field may work on the first magnetic layer 3 and the second magnetic layer 5 in a direction opposed to each other.

In addition, in the magnetic storage element 1 of the present embodiment, parts other than the storage layer shown in FIG. 1, such as means for heating the magnetic storage element 1, means for applying a magnetic field to the magnetic storage element 1 and means for reading out information may employ those selected from variety of structures.

With reference to FIGS. 2A to 2D, a recording method using a magnetic storage element according to the present embodiment will be described. It is noted that only the first magnetic layer 2, the non-magnetic layer 3 and the second magnetic layer 5 are described and the third magnetic layer 4 is omitted from illustration. In the figure, among magnetic moments existing in respective magnetic layers, magnetic moments of the rare-earth metal atoms are depicted as $RE_1$ and $RE_2$, magnetic moments of the transition metal atoms are depicted as $TM_1$ and $TM_2$, a synthesized magnetization representing a difference between the magnetic moments $RE_1$ and $TM_1$ in the first magnetic layer 2 is depicted as $H_1$, and a synthesized magnetization representing a difference between the magnetic moments $RE_2$ and $TM_2$ in the second magnetic layer 5 is depicted as $H_2$. In the respective magnetic layers, the magnetic moments $RE_1$ and $RE_2$ of the rare-earth metal atom and the magnetic moments $TM_1$ and $TM_2$ of the transition metal atom are in directions opposed to each other. In addition, because of the non-magnetic layer 3 disposed between the magnetic layers, there occurs an antiferromagnetic exchange coupling so that $TM_1$ and $TM_2$ are opposed to $RE_1$ and $RE_2$ with each other.

Figure 2A:
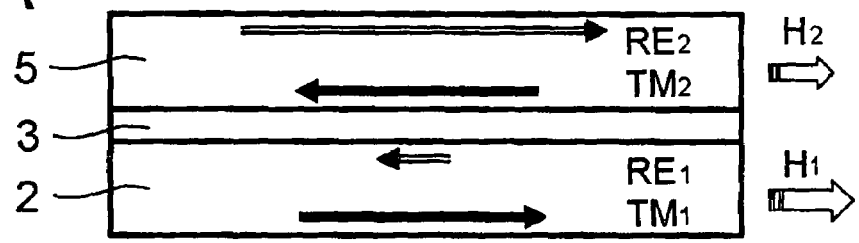
FIG. 2A to FIG. 2D are views explaining a method of information storing on the magnetic storage element of FIG. 1.

(1) Initial State (see FIG. 2A)

In this initial state, $TM_1$ is larger than $RE_1$ in the first magnetic layer 2 so that the synthesized magnetization $H_1$ becomes a rightward magnetization as $TM_1$ shown in the figure. In addition, $RE_2$ is larger than $TM_2$ in the second magnetic layer 5 so that the synthesized magnetization $H_2$ becomes a rightward magnetization as $RE_2$ shown in the figure. In other words, the synthesized magnetizations $H_1$ and $H_2$ have large coercive forces owing to the parallel magnetization and are stable.

Figure 2B:
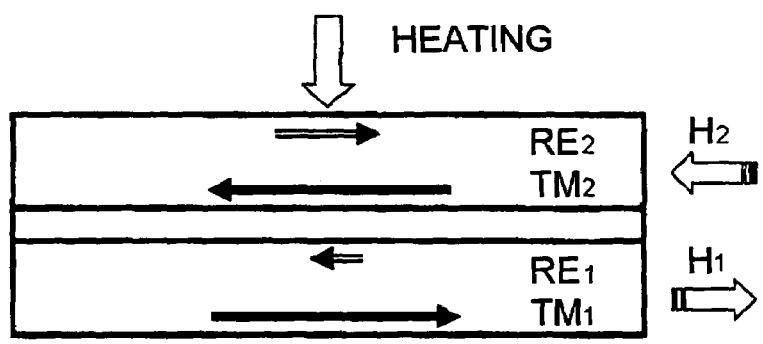

(2) Heated State (see FIG. 2B)

In this heated state, the magnetic moments $RE_1$ and $RE_2$ of the rare-earth metal atom of the first magnetic layer 2 and the second magnetic layer 5 becomes extremely small due to temperature rise. Therefore, the magnetic moments $TM_1$ and $TM_2$ remain and further, at or over the compensation temperature of the second magnetic layer 5, the synthesized magnetizations $H_1$ and $H_2$ of the respective magnetic layers have the same direction as the magnetic moments $TM_1$ and $TM_2$. In other words, since the synthesized magnetization $H_1$ of the first magnetic layer 2 works rightward as the initial state and the synthesized magnetization $H_2$ of the second magnetic layer 5 works leftward, directions of the synthesized magnetizations are anti-parallel so that the coercive force is weak.

Figure 2C:
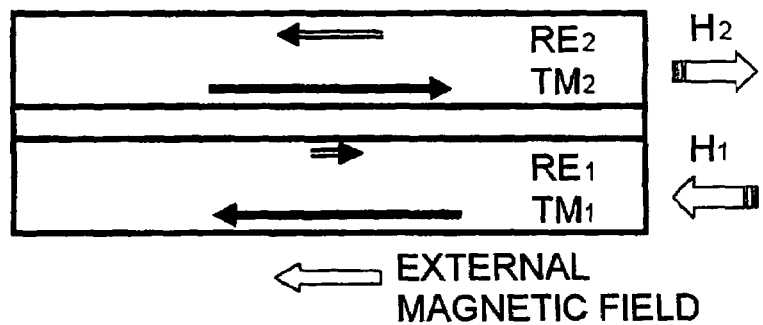

(3) External Magnetic Field Applied State (see FIG. 2C)

In this external magnetic field applied state, an external magnetic field (leftward in the figure) is applied under a condition where the coercive force is weak owing to the heated state (2) described above. The magnetization $TM_1$ of the transition metal atom in the first magnetic layer 2 is affected by the leftward external magnetic field to be inverted leftward, and in accordance therewith, the magnetization $TM_2$ in the second magnetic layer, which is exchange coupled thereto, is also inverted to rightward. Accordingly, the synthesized magnetization $H_1$ and the synthesized magnetization $H_2$ are inverted to leftward and rightward, respectively. In other words, information is recorded in the storage layer.

Figure 2D:
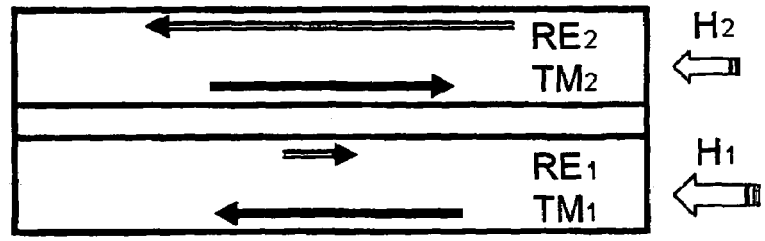

(4) Cooled State (see FIG. 2D)

In this cooled state, because of the cooling, the magnetic moments $RE_1$ and $RE_2$ of the rare-earth metal atom are recovered in the respective magnetic layers. The magnetic moments $RE_1$ and $RE_2$ of the rare-earth metal atom have directions opposing to the magnetic moments $TM_1$ and $TM_2$ of the transition metal atom. Accordingly, in the first magnetic layer 2, there occurs a small rightward magnetic moment $RE_1$ in correspondence with the leftward magnetic moment $TM_1$ and in the second magnetic layer 5, there occurs a large leftward magnetic moment $RE_2$ in correspondence with the rightward magnetic moment $TM_1$. Accordingly, since the synthesized magnetization $H_1$ becomes leftward and the synthesized magnetization $H_2$ also becomes leftward, directions of the synthesized magnetizations become parallel. In other words, because of the large magnetization due to the synthesized magnetizations $H_1$ and $H_2$, a stable state can be attained.

It is noted that if the magnetic storage element is heated by applying an electric current directly, it is possible to make the magnetic field induced by the electric current work on the first magnetic layer 2 and the second magnetic layer 5 in opposing directions to each other so that the magnetization direction after recording can be controlled depending on a flowing direction of the electric current. Therefore, it is possible to omit means for applying a recording magnetic field so that a structure of a drive circuit can be simplified.

In the magnetic storage element of the present embodiment, the synthesized magnetizations of the first magnetic layer 2 and the second magnetic layer 5 are in anti-parallel by heating and the coercive force becomes small, it is easy to carry out recording operation. In addition, the synthesized magnetizations of the magnetic layers 2 and 5 become parallel by being cooled after heating, and the coercive force becomes large. Using the magnetic storage element of the present embodiment, an MRAM can be composed. In the magnetic storage element of the present embodiment, it is possible to reduce the coercive force by heating so that a current induced magnetic field used for recording in the MRAM can be reduced in size and in addition, power consumption at the time of recording can also be reduced.

Figure 3:
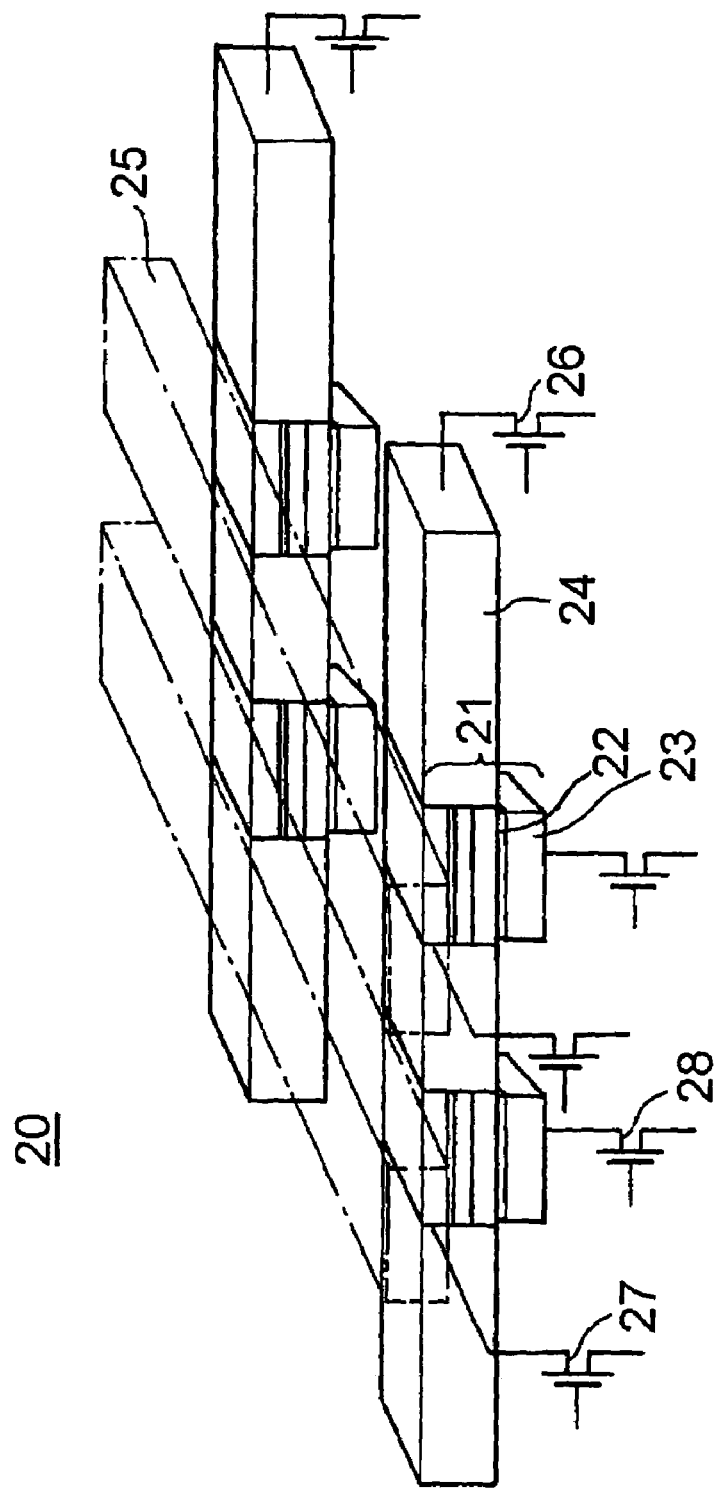
FIG. 3 is a schematic drawing of a magnetic random access memory using the magnetic storage element of FIG. 1.

A structural example of a magnetic random access memory (MRAM) to which the magnetic storage element of the above embodiment is shown in FIG. 3. As shown in FIG. 3, a magnetic storage element 21 comprises a tunnel barrier film 22 and a pinned film 23, a heating wiring 24 for supplying an electric current for heating, a magnetic field applying wiring 25 for applying a magnetic field, controlling MOS transistors 26, 27 for controlling the current to be supplied to each wiring and a reading MOS transistor 28 for reading recorded information. A plurality of unit magnetic storage elements are arranged in a matrix form to constitute a memory area of the MRAM. One main electrode of the reading MOS transistor 28 is connected to the pinned film 23, and a side of the first magnetic layer of the magnetic storage element 21 is connected to the pinned film 23 having the tunnel barrier film 22 therebetween. A side of the second magnetic layer of the magnetic storage element 21 is connected to the magnetic field applying wiring 25. In addition, one main electrode of the controlling MOS transistor 26 is connected to one end of the heating wiring 24, and the heating wiring 24 is connected to one side of the stacked structure of the magnetic storage element 21. In addition, one main electrode of the controlling MOS transistor 27 for controlling the electric current is connected to the magnetic field applying wiring 25.

Recording on the magnetic storage element 21 of the present embodiment can be carried out by supplying an electric current to the magnetic field applying wiring 25 while supplying the electric current to the heating wiring 24. When reading information recorded on the magnetic storage element 21, a tunnel current is supplied through the tunnel barrier film 22 and the pinned film 23 connected to the magnetic storage element to detect it.

As the heating means, a heating element may be disposed in the vicinity of the magnetic storage element or a laser beam may be radiated onto the magnetic storage element to heat it. As the means for detecting the magnetization and reading information, a hole element, instead of the tunnel barrier film 22 and the pinned film 23, may be formed on a semiconductor.

Figure 4A:
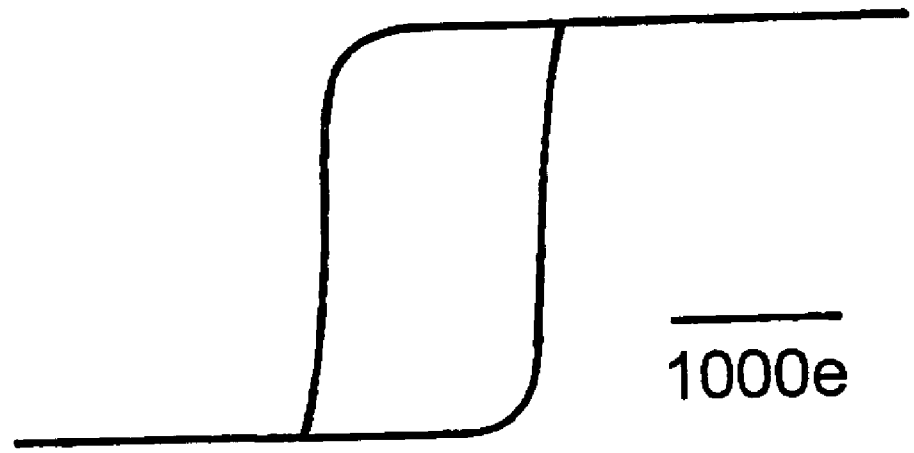
FIG. 4A and FIG. 4B are views each showing a magnetization curve of the magnetic storage element according to the present invention.

Here, the magnetic storage element shown in FIG. 1 is fabricated to investigate its characteristic features. A CoSiB layer having a thickness of 5 nm as the first magnetic layer 2, an Ru layer having a thickness of 0.8 nm as the non-magnetic layer 3, a Co layer having a thickness of 0.2 nm as the third magnetic layer 4, and a GdFeCo layer having a thickness of 12 nm as the second magnetic layer 5 are stacked to have the storage layer of a stacked structure. The stacked structured storage layer is processed to be a rectangle having a major axis of 4 μm and a minor axis of 2 μm by the photolithography. A magnetization curve measured in a long axis direction of the magnetic storage element is shown in FIG. 4. First, a magnetization curve at the room temperature is shown in FIG. 4A. Since an inner area surrounded by the curve is large, the magnetic storage element is stable in its magnetization state and has a large coercive force.

Figure 4B:
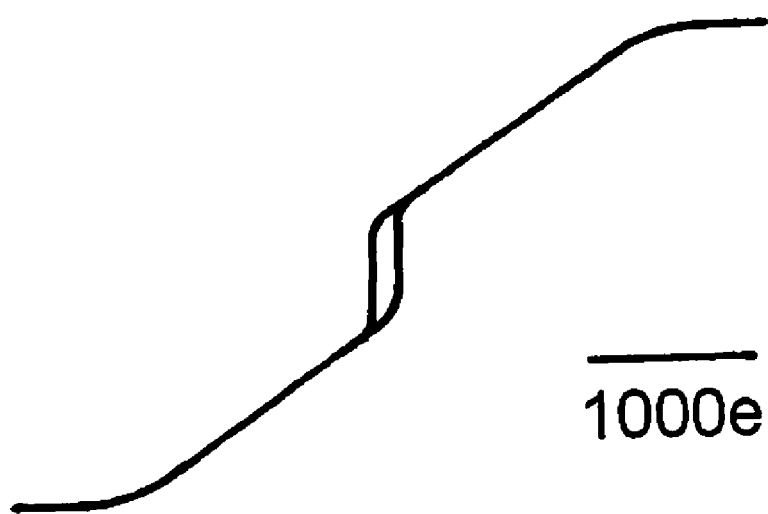

Next, a magnetization curve at 150° C. is shown in FIG. 4B. In this case, the inner area surrounded by the curve is small, and it is possible to easily invert the magnetization of the storage layer.

Figure 5:
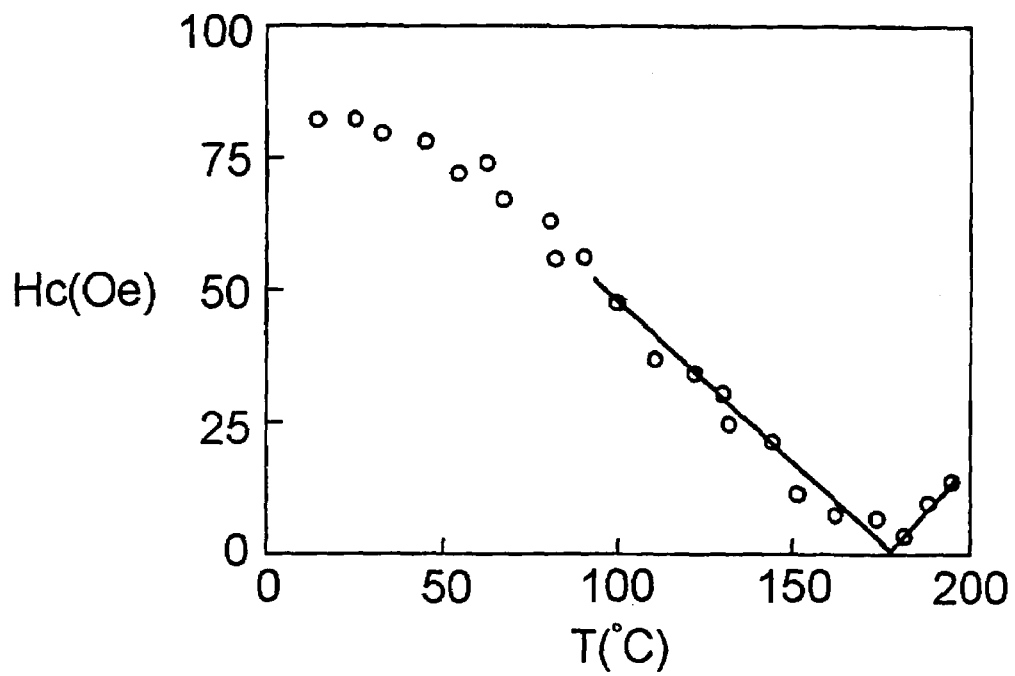
FIG. 5 is a view showing dependence of a coercive force (Hc) of a storage layer of the magnetic storage element of the present invention on a temperature (T).

In addition, dependence of a coercive force (Hc) of a storage layer measured in the major axis direction on a temperature (T) is shown in FIG. 5. The coercive force (Hc) shows its maximum value at around 0° C., and becomes smaller as the temperature rises to show its minimum value at around 175° C. Thereafter, the coercive force slightly recovers as the temperature rises. In other words, it can be seen that the coercive force largely varies depending on the temperature.

Figure 6:
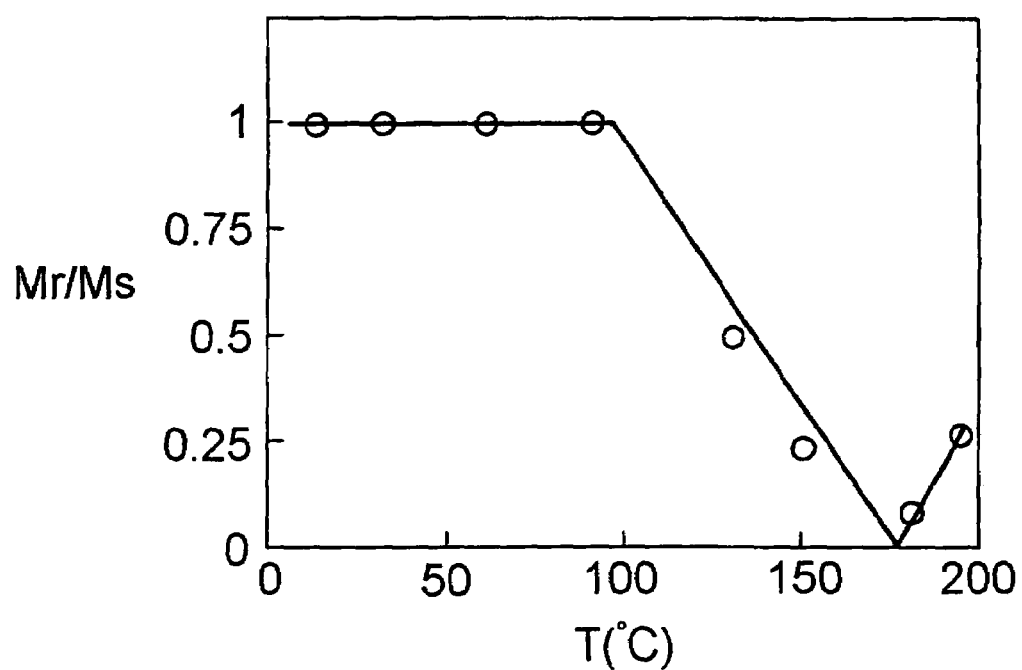
FIG. 6 is a view showing dependence of a ratio (Mr/Ms) of a remanent magnetization (Mr) and a saturated magnetization (Ms) of the magnetic storage element of the present invention on the temperature (T).

Furthermore, dependence of a ratio (Mr/Ms) of a remanent magnetization (Mr) and a saturated magnetization (Ms) of the storage layer on the temperature (T) is shown in FIG. 6. Until the temperature reaches 100° C. which is equal to the compensation temperature of the second magnetic layer (GdFeCo layer), a ratio of Mr/Ms is 1. When the temperature rises over the compensation temperature, the magnetizations of the first magnetic layer (CoSiB layer) and the second magnetic layer (GdFeCo layer) becomes parallel so that the ratio of Mr/Ms gradually decreases. Thereafter, at the temperature of about 175° C., the magnetization amounts of the first magnetic layer (CoSiB layer) and the second magnetic layer (GdFeCo layer) are equal so that the remanent magnetization (Mr) disappears. That is, in FIG. 5, the temperature at which the coercive force becomes the smallest corresponds to the temperature at which the magnetization amounts of the first magnetic layer (CoSiB layer) and the second magnetic layer (GdFeCo layer) are equal in FIG. 6.

Figure 7:
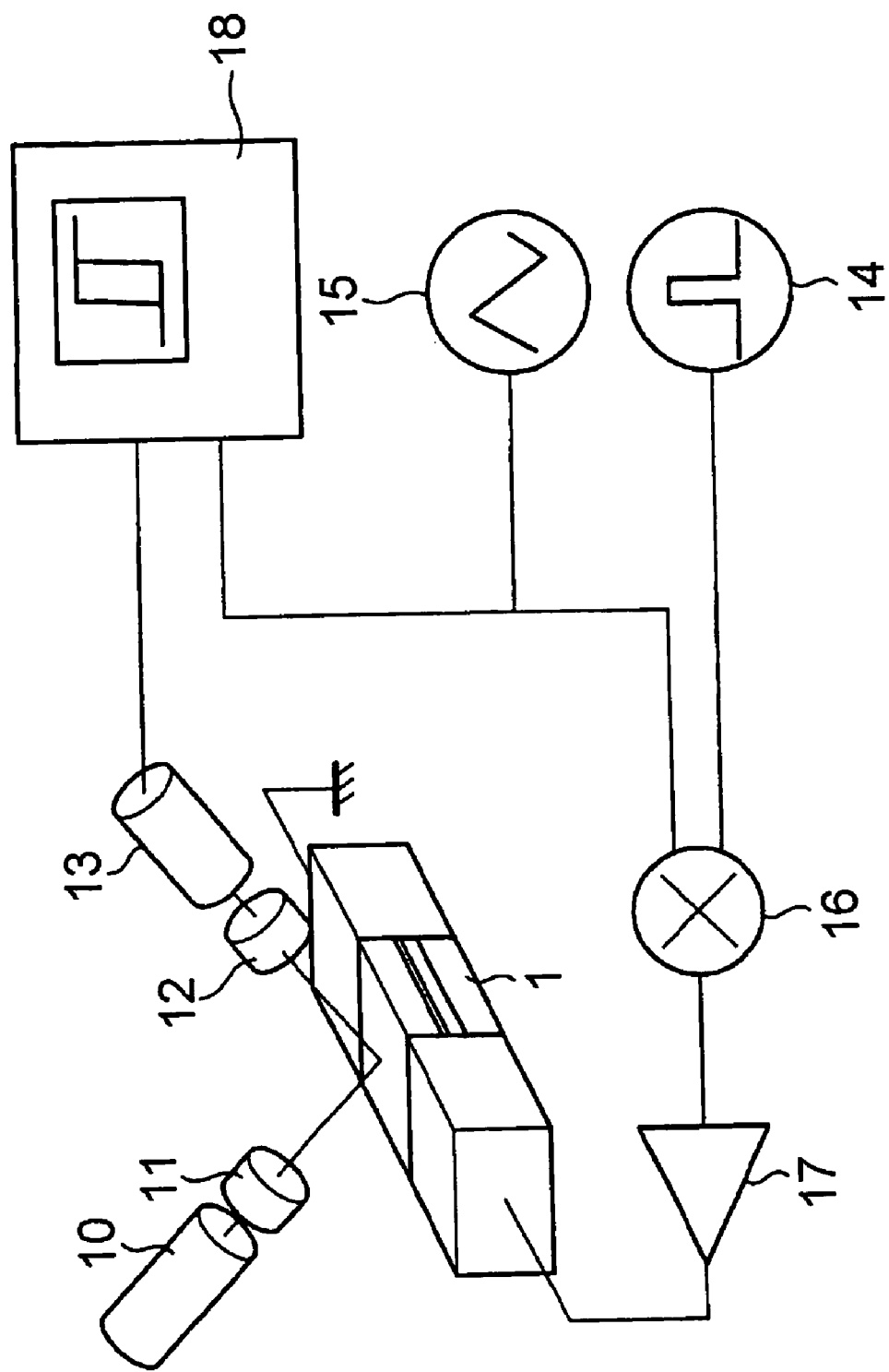
FIG. 7 is a view showing a method of measuring a reverse magnetization state due to an electric current against the storage layer of the magnetic storage element of the present invention.

Subsequently, a measurement apparatus is constituted as shown in FIG. 7, and an inverted state of the magnetization induced by the electric current of the magnetic storage element of the present invention was measured. Light irradiated from a laser light source 10 is straightly polarized by a polarizer 11, and the light irradiates the magnetic storage element 1. That is, the light reflected on the magnetic storage element 1 is rotated on a polarizing plane 12 by the Kerr effect and is received by a photo-detector 13 so that the light is detected as a signal corresponding to the magnetization state of the magnetic storage element 1. At this time, the magnetic storage element 1 multiplies a signal of a pulse transmitter 14 and a signal of a low frequency transmitter 15 using a multiplier and is driven by a driver amplifier 17. Since an amplitude of a pulse signal is in proportion with a signal voltage of the low frequency transmitter, if the signal voltage of the low frequency transmitter is shown in a horizontal line and a signal of the photo-detector is shown in a vertical line on a display device 18, it is possible to display the inverted magnetization state with regard to the pulse current value. For example, measurement was carried out under conditions of the pulse signal of 0.1 ms in width, a frequency of the low frequency transmitter of 10 Hz, and that an electric current terminal is disposed at each end of the minor axis of the magnetic storage element having the minor axis of 2 μm and the major axis of 4 μm so as to have an element group in which 10 pieces of the magnetic storage elements are connected serially, first, and then, ten element groups are connected in parallel.

Figure 8:
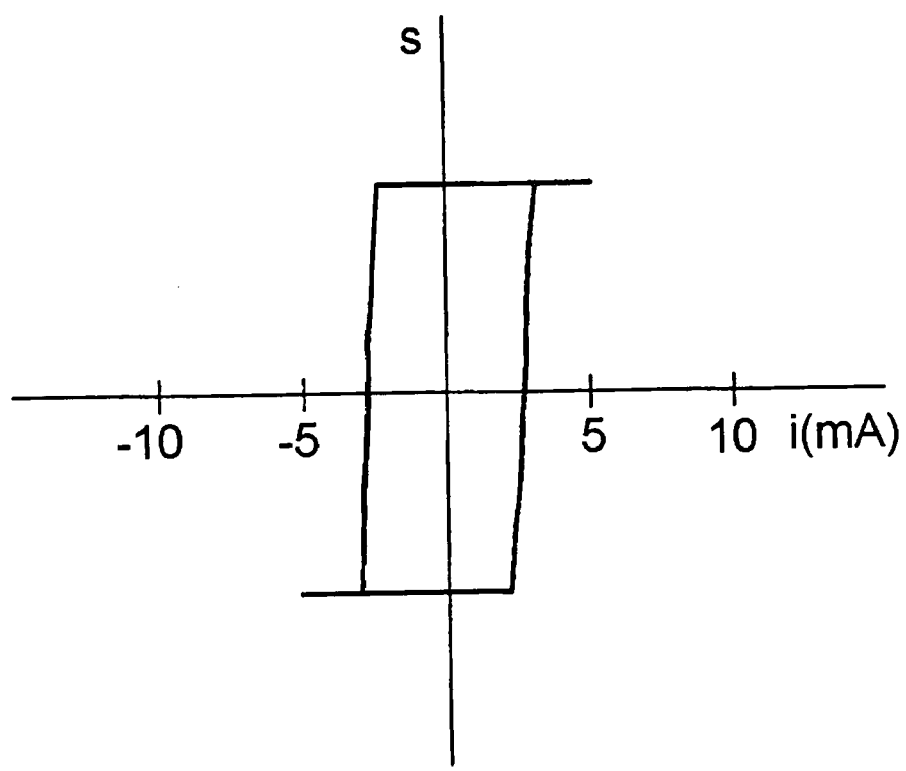
FIG. 8 is a view showing relationship between a pulse current value "i" per the magnetic storage element according to the present invention and a photo-detector signal "s".

As a result of this measurement, relationship between a pulse current value i per the magnetic storage element and a photo-detector signal s is shown in FIG. 8. As is apparent from FIG. 8, the magnetization is inverted at a current value of around 3 mA. In other words, the magnetic storage element according to the present invention shown in FIG. 1 can invert the magnetization with a small amount of electric current.

Figure 9:
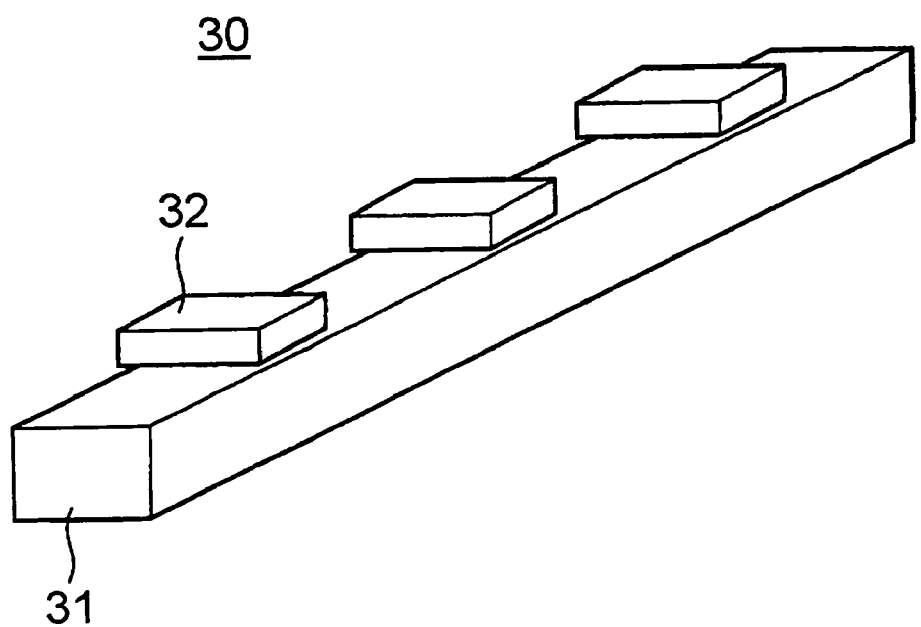
FIG. 9 is a view showing a magnetic storage element of a comparative example and a wiring for a magnetic field thereof.
Figure 10:
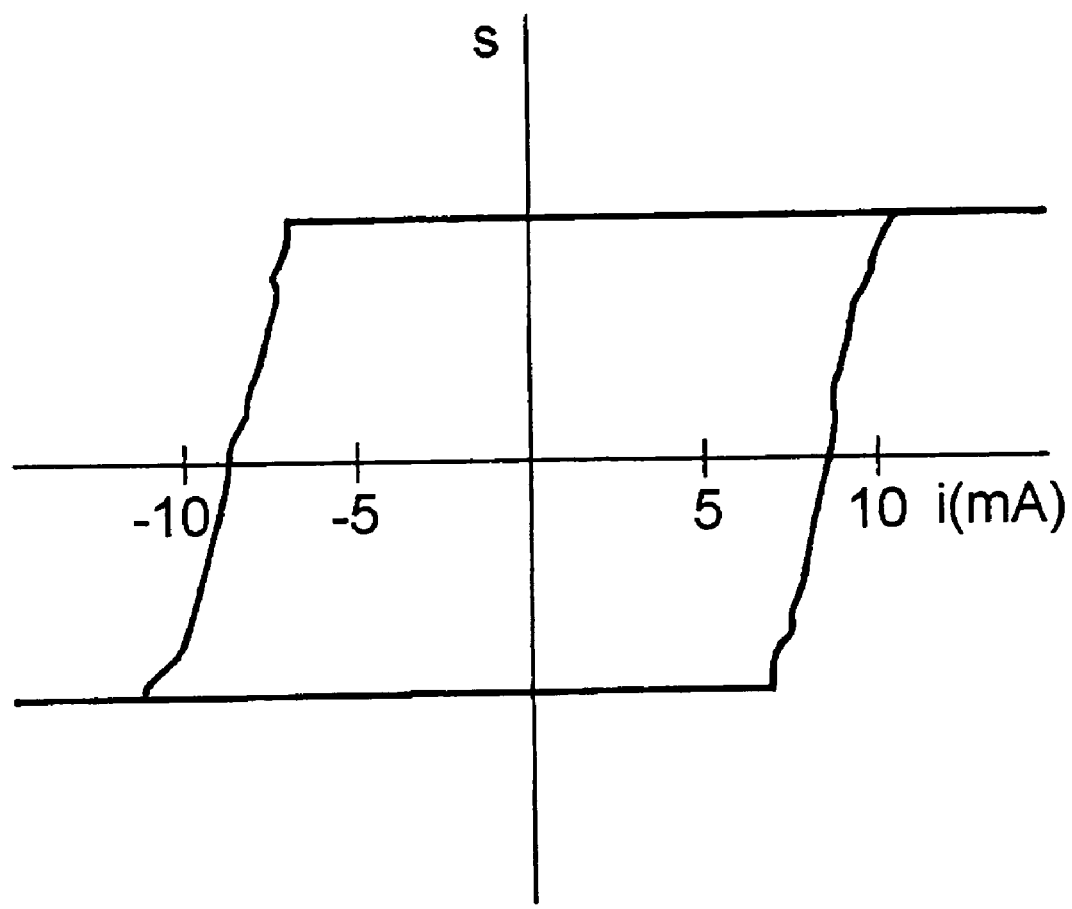
FIG. 10 is a view showing relationship between a pulse current value "i" per the magnetic storage element according to the comparative example and a photo-detector signal "s".

Next, as a comparative example, as shown in FIG. 9, on a magnetic field generating current line 31, a magnetic storage element 32 having a minor axis of 2 μm and a major axis of 4 μm composed of a single CoSiB layer having a thickness of 5 nm with an insulating layer therebetween. The same measurement as FIG. 7 was carried out in this configuration and a result thereof is shown in FIG. 10. As can be seen from FIG. 10, 10 mA or more of electric current is required for inverting the magnetization. In other words, the magnetic storage element 31 of the comparative example requires a large amount of current for recording using a current induced magnetic field. On the contrary, the magnetic storage element of the present invention can largely reduce the amount of current used for recording.

It is to be noted that the present invention is by no means limited to the above-described embodiments, and other various configurations are allowable without departing from the essential spirit of the present invention.

What is claimed is:

1. A magnetic storage element, comprising at least a first magnetic layer, a non-magnetic layer and a second magnetic layer which are stacked, wherein:
   said first magnetic layer comprises a ferrimagnetic component of a rare-earth metal-transition metal alloy in which an amount of magnetization of a ferromagnetic component mainly composed of a transition metal or a transition metal atom is larger than that of a rare-earth metal atom,
   said second magnetic layer comprises a ferrimagnetic material containing a rare-earth metal-transition metal alloy having a compensation temperature, and
   a magnetic moment of the transition metal atom of said first magnetic layer and a magnetic moment of the rare-earth metal atom of said second magnetic layer are magnetically coupled to be parallel.

2. A magnetic storage element, comprising at least a first magnetic layer, a non-magnetic layer, a ferromagnetic layer and a second magnetic layer which are stacked, wherein:
   said first magnetic layer comprises a ferrimagnetic component of a rare-earth metal-transition metal alloy in which an amount of magnetization of a ferromagnetic component mainly composed of a transition metal or a transition metal atom is larger than that of a rare-earth metal atom,
   said second magnetic layer comprises a ferrimagnetic material containing a rare-earth metal-transition metal alloy having a compensation temperature, and
   a magnetic moment of the transition metal atom of said first magnetic layer and a magnetic moment of the rare-earth metal atom of said second magnetic layer are magnetically coupled to be parallel, and wherein:

said ferromagnetic layer is mainly composed of a transition metal and is positioned between said second magnetic layer and said non-magnetic layer.

3. The magnetic storage element as claimed in claim 2, wherein:

both of said first magnetic layer and said second magnetic layer are amorphous layers.

4. A recording method using a magnetic storage element comprising at least a first magnetic layer, a non-magnetic layer and a second magnetic layer which are stacked, wherein:

said first magnetic layer comprises a ferrimagnetic component of a rare-earth metal-transition metal alloy in which an amount of magnetization of a ferromagnetic component mainly composed of a transition metal or a transition metal atom is larger than that of a rare-earth metal atom, said second magnetic layer comprises a ferrimagnetic material containing a rare-earth metal-transition metal alloy having a compensation temperature, and a magnetic moment of the transition metal atom of the first magnetic layer and a magnetic moment of the rare-earth metal atom of the second magnetic layer are magnetically coupled to be parallel, wherein said recording method is carried out by:

heating the magnetic storage element locally, and applying a magnetic field at a temperature where a magnetization amount of said first magnetic layer and a magnetization amount of said second magnetic layer are equal.

5. The recording method of a magnetic storage element as claimed in claim 4 wherein:

said heating is carried out by directly supplying an electric current on the magnetic storage element.

* * * * *